United States Patent [19]

Cross

[11] Patent Number: 4,694,263

[45] Date of Patent: Sep. 15, 1987

[54] FREQUENCY MODULATION MONITOR CIRCUIT AND METHOD

[75] Inventor: Richard A. Cross, Garland, Tex.

[73] Assignee: Rockwell International Corporation, El Segundo, Calif.

[21] Appl. No.: 872,074

[22] Filed: Jun. 9, 1986

[51] Int. Cl.$^4$ ............................................. G01R 23/15
[52] U.S. Cl. ....................................... 332/20; 331/44; 324/78 Z
[58] Field of Search .......................... 332/16 R, 19, 20; 455/115, 119, 205, 208; 324/78 Z; 331/44, 64

[56] References Cited

U.S. PATENT DOCUMENTS 3,571,760  3/1971  Schwartz .............................. 332/20
4,405,897  9/1983  Taylor et al. ...................... 332/20 X
4,573,026  2/1986  Curtis et al. ...................... 332/19 X Primary Examiner—Eugene R. LaRoche
Assistant Examiner—Robert J. Pascal
Attorney, Agent, or Firm—Bruce C. Lutz; V. L. Sewell; H. Fredrick Hamann

[57] ABSTRACT

A method and apparatus for monitoring a frequency modulated signal including harmonically mixing the modulated signal with a significantly lower reference frequency, dividing the mixed signal, filtering out the reference frequency, rectifying and integrating the filtered frequency and then testing the integrated signal is disclosed. A correction signal responsive to the integrated signal is provided in one arrangement.

10 Claims, 2 Drawing Figures

4,694,263

1

FREQUENCY MODULATION MONITOR CIRCUIT AND METHOD

TECHNICAL FIELD

The present invention relates generally to monitoring frequency modulated signals, and in one of its aspects, relates to a circuit and method of monitoring the relative frequency deviation of a direct modulated microwave carrier.

Direct modulated microwave carriers which hve digital, pseudorandom data such as four level FSK modulation tend to have problems with deviation from the licensed carrier bandwidth. Monitoring such deviation in the 18 gigahertz range present unique problems in itself.

BACKGROUND ART

In the past, if the expense could be justified, a frequency spectrum analyzer could be used to monitor carrier frequency deviation of direct modulated microwave systems. Where such expense could not be justified, users would resort to regular component inspection and replacement. In some cases, it was attempted to monitor the frequency deviation by attempting to hold the applied modulation magnitude constant.

DISCLOSURE OF THE INVENTION

In accordance with the present invention, a method for monitoring a frequency modulated signal includes the combination of harmonically mixing the modulated signal with a significantly lower carrier frequency, dividing the mixed signal, filtering out the carrier frequency from the divided signal, rectifying the carrier filtering signal, integrating the rectified signal and testing the integrated signal. In one arrangement, a correction signal responsive to the integrated signal is provided to an automatic gain control loop amplifier and fed back to the signal before it is modulated.

In an arrangement of the present invention for monitoring a frequency modulated signal from a Gunn effect modulation oscillator having a frequency greater than 10 gigahertz, normally in the 18 gigahertz range, a reference signal is generated at a frequency lower than 1 gigahertz and is harmonically mixed with the modulated signal from the Gunn effect modulation oscillator. The mixed signal is divided by a number greater than 64, probably in two steps: first dividing by 64 in a prescaler and then dividing that result by 4 with a digital frequency divider. The carrier frequency is then filtered out from the divided signal, and the carrier filtered signal is rectified and integrated. Typically with a Gunn effect oscillator having a frequency of approximately 18 gigahertz, the reference frequency is approximately 1/20 of 17.8 gigahertz.

BRIEF DESCRIPTION OF DRAWING

The details of the invention will be described in connection with the accompanying drawing, in which.

BEST MODE FOR CARRYING OUT THE INVENTION

Figure 1:
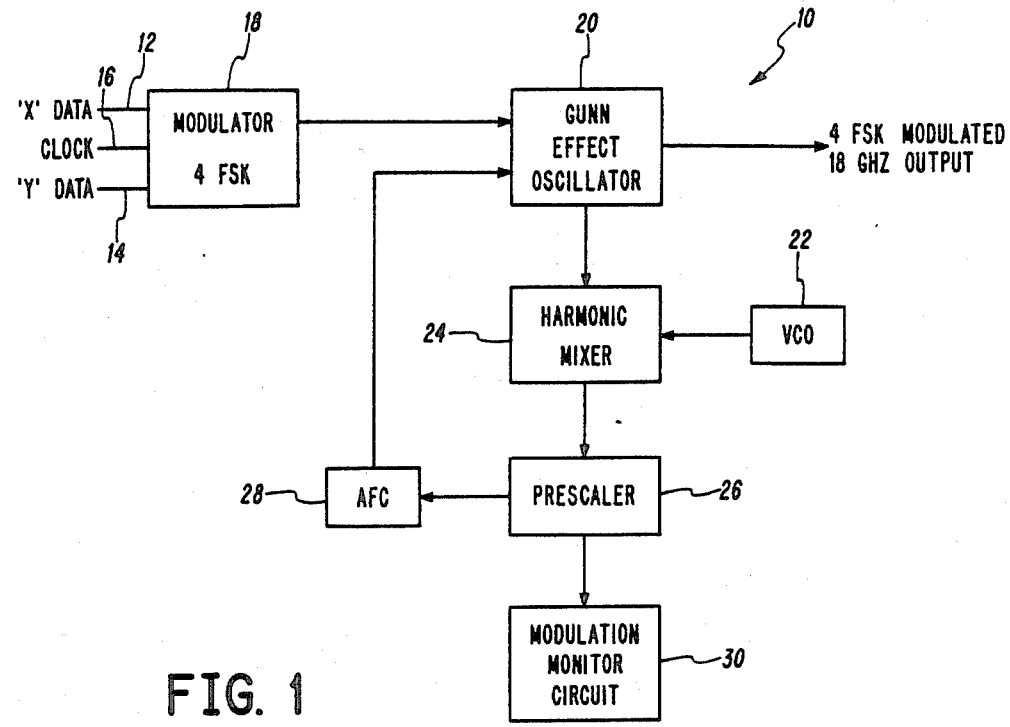
FIG. 1 is a diagrammatic view of a frequency modulation system employing a method and apparatus according to the present invention for monitoring the frequency modulated signal.

Referring now to the drawing, and in particular to FIG. 1, a frequency modulation circuit is referred to generally by reference numeral 10. Frequency modulation circut 10 accepts digital data from two data supply rails 12 and 14 for X and Y data respectively, as well as clock 16. A modulator 4FSK 18 converts the X and Y data to an analog signal, perhaps preshaping the analog signal. A Gunn effect oscillator 20 modulates the analog signal at a license to transmit frequency in excess of 10 gigahertz, approximately 18 gigahertz being typical. A voltage controlled oscillator 22 generates a carrier signal of a frequency significantly lower than the modulated signal, in the embodiment illustrated, approximately 1/20 of 17.8 gigahertz. A harmonic mixer 24 mixes the modulated signal from Gunn effect oscillator 20 with the carrier signal from voltage controlled oscillator 22, and a prescaler 26 divides the mixed signal by 64 for use by an automatic frequency control circuit 28. The output of automatic frequency control circuit 28 is then fed back to Gunn effect oscillator 20, completing the AFC loop for controlling the Gunn effect oscillator.

Figure 2:
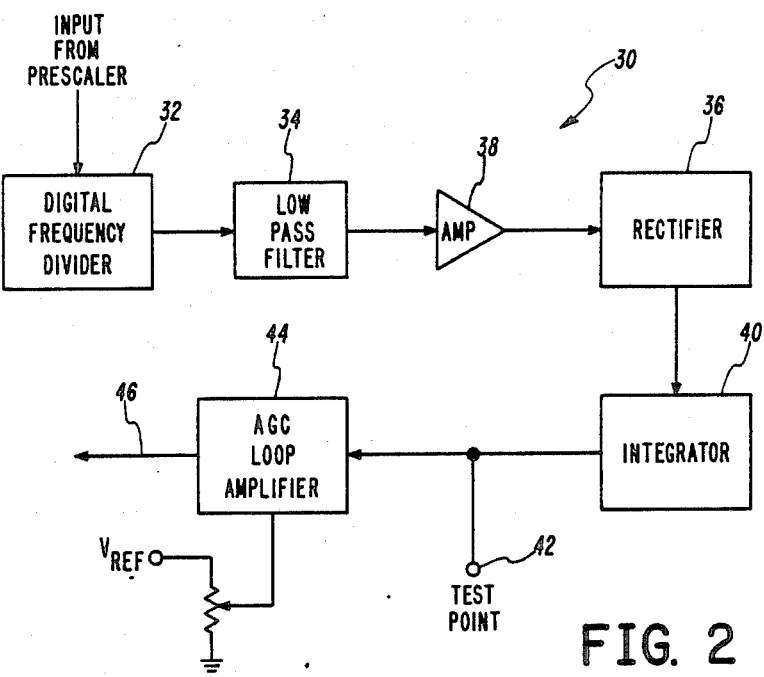
FIG. 2 is a diagrammatic view of a monitor according to the present invention for a frequency modulated signal.

Referring also to FIG. 2, a modulation monitor circuit according to the present invention is referred to by reference numeral 30. Modulation monitor circuit 30 includes a digital frequency divider 32 for further dividing the divided difference frequency of prescaler 26, in the embodiment illustrated by 4. A low pass filter 34 filters out the carrier frequency of voltage controlled oscillator 22 from the further divided signal, and the carrier filtered signal is then rectified by a rectifier 36 after amplification and isolation by amplifier 38. The output of rectifier 36 is thus the basic modulation information which is integrated by an integrator 40. Means 42, which can be a simple output terminal, is provided at the output of integrator 40 for testing the integrated signal. The direct current voltage at test point 42 is proportional to the frequency modulation deviation of Gunn effect oscillator 20.

In one arrangement, modulation monitor circuit 30 also includes means such as AGC loop amplifier 44 for providing a correction signal 46 responsive to the integrated signal at the output of integrater 40. Correction signal 46 can be fed back to modulator 4FSK 18 to control the size of the modulation envelope. The correction signal would most likely be fed back to a digital to analog converter or a voltage controlled amplifier within modulator 4FSK 18.

It is now easy to see that a modulation monitor according to the present invention can replace expensive test equipment for use with pseudorandom data. Voltage controlled oscillator 22 can have a frequency built up by increments and, therefore, adjustable according to license frequency. Voltage controlled oscillator 22 in a preferred form is phase locked to a crystal oscillator and, since it operates below 1 gigahertz, it is possible to obtain good low cost frequency dividers for use in the automatic frequency control loop. For an 18 gigahertz Gunn effect oscillator and a voltage controlled oscillator with a 20th harmonic of 17.8 gigahertz, the difference frequency at the output of harmonic mixer 24 is 200 megahertz. The output of the signal from harmonic mixer 24 would also have gain and filtering in a preformed form. The prescaler divides the 200 megahertz difference frequency by 64, providing an output to both automatic frequency control circuit 28 and modulation monitor circuit 30 of 3.125 megahertz.

From the foregoing, it will be seen that this invention is one well adapted to attain all of the ends and objects hereinabove set forth, together withother advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

I claim:

1. A method for monitoring frequency deviation of a frequency modulated signal from a system having a modulation oscillator and an automatic frequency control feedback loop, the loop including a harmonic mixer which provides a difference frequency from the signal to a prescaler which provides a divided difference frequency, the method including in combination the steps of:
   further dividing the divided difference frequency of the prescaler;
   filtering out the carrier frequency from the further divided signal;
   rectifying the carrier filtered singal; integrating the rectified signal; and testing the integrated signal.

2. A method according to claim 1 further including the step of providing a correction signal to the frequency modulation system responsive to the integrated signal.

3. A method for monitoring a frequency modulated signal, including in combination the steps of:
   harmonically mixing the modulated signal with a significantly lower reference frequency;
   dividing the mixed signal; filtering out the reference frequency from the divided signal;
   rectifying the reference filtered signal;
   integrating the rectified signal; and
   testing the integrated signal.

4. A method according to claim 3 further including the step of providing a correction signal responsive to the integrated signal.

5. A method for monitoring frequency deviation of a frequency modulated signal from a Gunn effect modulation oscillator having a frequency greater than ten gigahertz, including in combination the steps of:
   generating a reference signal of a frequency lower than one gigahertz;
   harmonically mixing the modulated signal with the reference signal;
   dividing the mixed signal by a number greater than sixty-four;
   filtering out the reference frequency from the divided signal;
   rectifying the reference filtered signal;
   integrating the rectified signal; and
   testing the integrated signal.

6. A method according to claim 5 wherein:
   the Gunn effect oscillator has a frequency of approximately 18 gigahertz;
   the carrier frequency is approximately one twentieth of 17.8 gigahertz; and
   the number greater than sixty-four is 256.

7. A method according to claim 6 wherein the step of dividing the mixed signal includes in combination the steps of:
   dividing the mixed signal by sixty-four; and
   further dividing the divided signal by four.

8. A frequency deviation monitor for a frequency modulated signal, including in combination:
   a voltage controlled oscillator for generating a reference signal;
   a harmonic mixer for mixing the modulated signal with the reference signal;
   means for dividing the mixed signal;
   a filter to filter out the reference frequency;
   means for rectifying the reference filtered signal; and
   means for integrating the rectified signal.

9. A monitor according to claim 8 further including means for testing the integrated signal.

10. A monitor according to claim 9 wherein the means for dividing includes a prescaler for making a first division and a divider for further dividing the divided signal of the prescaler wherein the divided signal of the prescaler is also used for an automatic gain control signal for the frequency modulated signal.

* * * * *